ELECTROMECHANICAL TRANSDUCER COUPLED TO A LOW INPUT IMPEDANCE TRANSISTOR AMPLIFIER AND YIELDING A FLAT RESPONSE OVER A GIVEN FREQUENCY RANGE

Filed Aug. 25, 1965

Inventors
WILLIAM D CRAGG
GEORGE J.P. BARNES
By [signature]
Attorney

United States Patent Office 3,445,595
Patented May 20, 1969

3,445,595
ELECTROMECHANICAL TRANSDUCER COUPLED TO A LOW INPUT IMPEDANCE TRANSISTOR AMPLIFIER AND YIELDING A FLAT RESPONSE OVER A GIVEN FREQUENCY RANGE

William Donald Cragg and George J. P. Barnes, London, England, assignors to International Standard Electric Corporation, New York, N.Y., a corporation of Delaware Filed Aug. 25, 1965, Ser. No. 482,424
Claims priority, application Great Britain, Sept. 11, 1964, 37,242/64
Int. Cl. H04r *19/04;* H04m *1/00*
U.S. Cl. 179—1 1 Claim

ABSTRACT OF THE DISCLOSURE

A capacitive microphone wherein an acoustic resistance in the form of a perforated metal sheet is closely spaced to the diaphragm of the microphone, said acoustic resistance being larger than the reactance of the diaphragm over the operating frequency range of the microphone, thereby providing an output voltage which decreases as the input frequency increases. The microphone is connected to a low input impedance transistor amplifier, thereby providing a constant output voltage over the operating frequency range.

This invention relates to an electro-mechanical transducer arrangement.

Condenser microphones per se are attractive acoustically on account of small size, simplicity and a periodic response. They are customarily made to have a constant voltage output for a given sound pressure over the working frequency range.

When such a microphone is used in conjunction with an associated amplifier, as the source impedance of the condenser microphone as an electric generator is only about 100 pf., the amplifier therefore has to have a high input impedance, of the order of 100 megohms, to avoid reducing the bass sensitivity of the condenser microphone.

Difficulties arise when it is desired to use a bipolar transistor (whereby a bipolar transistor is meant a semiconductor device which conducts current utilizing both majority and minority carriers, as opposed to a unipolar semiconductor device such as a field-effect transistor which conducts current utilizing only minority carriers) amplifier in association with a condenser microphone, for example in a deaf aid where it is desirable to keep weight and size to a minimum, because bipolar transistor amplifiers have a low resistive impedance input (e.g. 10K–100K ohms) so that a constant condenser microphone feeding into such an amplifier would produce an overall output rising at 6 db/octave with increasing frequency. Bipolar transistor amplifiers can only be given a very high input impedance at the expense of a prohibitive increase in relative noise level.

Similar considerations arise where it is desired to use a condenser microphone as a telephone transmitter and feeding into the low resistive impedance of a transmission line.

According to the invention there is provided an electro-mechanical transducer arrangement comprising a high reactive impedance electro-mechanical capacitive transducer having its electrical output terminals connected across a low resistive impedance means in which the transducer has a voltage output response falling with increasing input frequency so that the overall voltage output response of the arrangement is substantially constant.

Figure 1:
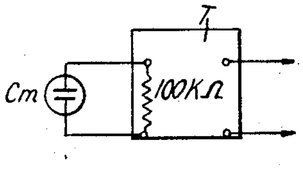
Figure 2A:
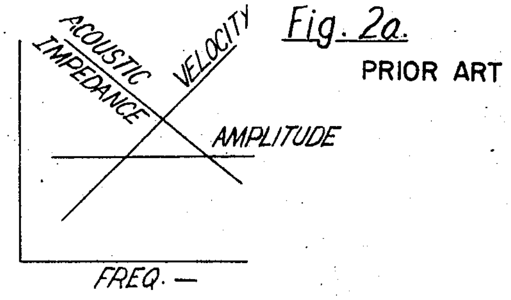
Fig. 2a. PRIOR ART
Figure 2B:
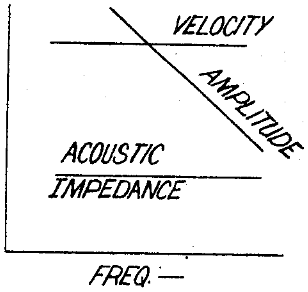
Figure 3:
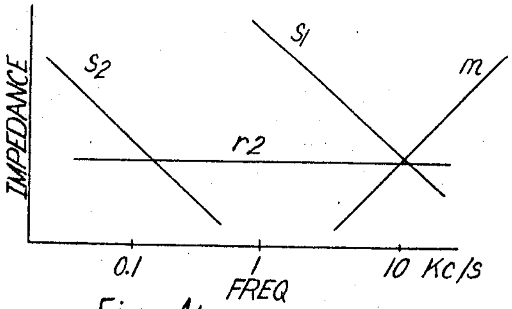
Figure 4A:
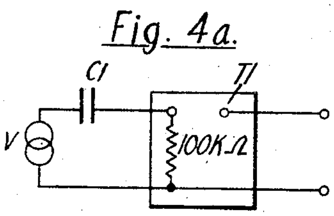
Figure 4B:
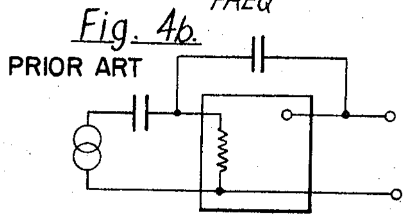
Fig. 4b. PRIOR ART
Figure 5:
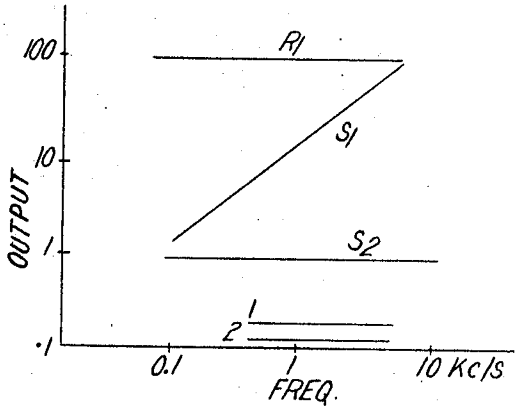
Figure 6:
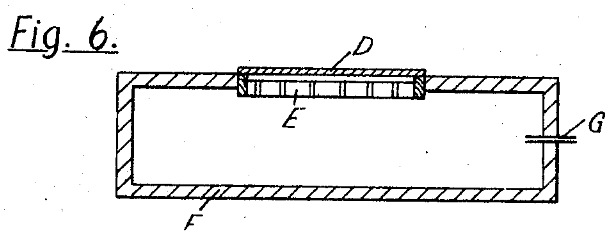

A preferred embodiment of the invention will now be described with reference to the accompanying drawings, in which:

FIG. 1 is a schematic circuit diagram of a condenser microphone feeding into a transistor amplifier, FIG. 2*a* shows characteristics of a known form of condenser microphone, FIG. 2*b* shows characteristics of a condenser microphone embodying the invention, FIG. 3 shows for comparison further characteristics of the above detailed condenser microphones, FIG. 4*a* shows a transducer arrangement according to the invention with a condenser microphone having the characteristics of FIG. 2*b*, FIG. 4*b* shows a known form of transducer arrangement with a condenser microphone having the characteristics of FIG. 2*a*, FIG. 5 shows for comparison characteristics of the two microphones, FIG. 6 is a sectioned view of a condenser microphone embodying the invention.

In FIG. 1 a condenser microphone $Cm$ feeds into a transistor amplifier T having a gain of 100. If it is assumed that $Cm$ is 100 pf. and that the input impedance of the amplifier T is 100,000 ohms, (resistive) then $Cm$ must generate a voltage falling at 6 db/octave with increasing frequency in order to produce a flat overall output.

For a condenser microphone operating on the constant charge principle with a constant pressure drive at all frequencies, the voltage output will be constant if the acoustic input impedance is controlled for controlling the stiffness of the diaphragm. The relationship between acoustic impedance and output is shown in FIG. 2*a*. If the acoustic input impedance is resistively controlled then the output will fall at 6 db per octave (no other conditions being altered) shown in FIG. 2*b*.

In the stiffness controlled unit the resonance between diaphragm stiffness S1 and diaphragm mass M must be placed near the upper end of the frequency range shown by the intersection of S1 and $m$ in FIG. 3. In a unit with the input impedance resistance controlled the resonance of the stiffness S2 and $m$ will be at about the mid-frequency, about 1 kc./s., and an acoustic resistance of value $r_2$ is introduced, closely coupled to the diaphragm. The resistance, stiffness and mass are adjusted so that the resistance is the controlling impedance over the required frequency range, e.g. 50 c./s. to 8,000 c./s. for good quality or 300 to 3,000 c./s. for telephonic work.

When translated into a practical example the relative impedance will be as shown in FIG. 3, i.e. the controlling stiffness S1 and $r_2$ will be about equal at the higher frequency end of the band. Consequently the amplitude of movement of the diaphragms of stiffness and resistance controlled microphones and therefore their outputs, will be equal at the higher frequencies, and the resistance controlled device (FIG. 2*b*) will be the more sensitive for lower frequencies.

Considering now the condenser microphone capsule in conjunction with a bipolar transistor amplifier, take an amplifier T1 with a gain of a hundred as in FIG. 4*a*, with input resistance 100K ohms and the condenser microphone represented by a voltage source V in series with a capacitor C1 of 100 pf. The outputs of the amplifier for various conditions are shown in FIG. 5, where curve S1 is the output for a normal constant voltage microphone, the slope being the result of attenuation of 100 pf. in series with 100K ohms. Curve R1 is the output for an acoustic resistance controlled condenser microphone and curve S2 the output for a normal stiffness controlled capsule working into an amplifier with capacity feedback, as in FIG. 4*b*. The relative output levels can be approximately as shown in FIG. 5 so that the difference in level between the two flat characteristics may approach 40 db, with the acoustic resistance controlled condenser microphone giving the higher overall sensitivity.

The noise levels of the two amplifier arrangement of FIGS. 4*a* and 4*b* are indicated by the lines labelled 1 and 2 in FIG. 5, the noise for the amplifier with feedback being about 10 db lower.

Thus the overall advantages in favour of the resistance controlled condenser microphone are a higher output level and a better signal to noise ratio.

The condenser microphone itself is as shown in FIG. 6, with a diaphragm D of metalised plastic sheet spaced about 1 mil from an insulated back electrode E, which can provide the acoustic resistance in the form of a perforated metal sheet, or sintered metal or sintered dielectric particles. The latter, of course, would carry a metalised covering on its upper surface to form the back electrode. The microphone case F has a tube G leading into the interior to form an ambient pressure equaliser. The characteristic feature of the construction is the dimension of diaphragm and acoustic resistance so that the acoustic resistance is larger than the reactance of the diaphragm over the working range, e.g. 300 to 4,000 c./s. for telephone use.

The polarising charge required (50 volts or more) may be built into the microphone in the form of an electret, i.e. a permanently polarized element, or supplied from an external source if weight and size are of no particular concern.

It is to be understood that the foregoing description of specific examples of this invention is made by way of example only and is not to be considered as a limitation on its scope.

What we claim is:

1. In combination, a capacitive microphone which provides an output whose gain decreases with an increase in input frequency, and a low input impedance transistor amplifier connected together so as to provide an overall gain which is constant regardless of the frequency of the input to said capacitive microphone, wherein said capacitive microphone comprises:

a diaphragm;

an insulated back electrode in the form of a perforated metal sheet providing acoustic resistance, and being closely spaced to said diaphragm;

said acoustic resistance being larger than the acoustic reactance provided by the stiffness of said diaphragm over the operating frequency range.

References Cited

UNITED STATES PATENTS

| | | | |
|---|---|---|---|
| 2,787,671 | 4/1957 | Grosskopf et al. | 179—111 |
| 3,082,298 | 3/1963 | Görike | 179—111 |
| 3,108,162 | 10/1963 | Schindler | 179—111 |
| 3,116,366 | 12/1963 | Seligson | 179—106 |

KATHLEEN H. CLAFFY, *Primary Examiner.*

ROBERT P. TAYLOR, *Assistant Examiner.*